United States Patent
Mays et al.

[11] Patent Number: 6,059,173
[45] Date of Patent: May 9, 2000

[54] MICRO GRID ARRAY SOLDER INTERCONNECTION STRUCTURE FOR SECOND LEVEL PACKAGING JOINING A MODULE AND PRINTED CIRCUIT BOARD

[75] Inventors: Allen Thomas Mays; Kris Allan Slesinger, both of Charlotte; Michael Camillo Weller, Harrisburg, all of N.C.

[73] Assignee: International Business Machines Corporation, Armonk, N.Y.

[21] Appl. No.: 09/035,538

[22] Filed: Mar. 5, 1998

[51] Int. Cl.[7] .......................... B23K 31/00; B23K 31/02; B23K 35/14
[52] U.S. Cl. ...................................... 228/180.22; 228/56.3
[58] Field of Search ............................. 228/180.1, 180.21, 228/180.22, 56.3

[56] References Cited

U.S. PATENT DOCUMENTS

| | | | |
|---|---|---|---|
| 3,871,015 | 3/1975 | Lin et al. | 357/67 |
| 4,545,610 | 10/1985 | Lakritz et al. | 29/589 |
| 4,604,644 | 8/1986 | Beckham et al. | 357/80 |
| 4,605,153 | 8/1986 | Van Den Brekel et al. | 228/56.3 |
| 4,967,313 | 10/1990 | Berner | 361/400 |
| 5,216,278 | 6/1993 | Lin et al. | 257/688 |
| 5,627,406 | 5/1997 | Pace | 257/700 |
| 5,639,696 | 6/1997 | Liang et al. | 437/209 |
| 5,790,384 | 8/1998 | Ahmad et al. | 361/760 |
| 5,791,911 | 8/1998 | Fasano et al. | 439/63 |
| 5,796,590 | 8/1998 | Klein | 361/774 |
| 5,848,702 | 12/1998 | Pakeriasamy | 206/725 |
| 5,861,678 | 1/1999 | Schrock | 257/783 |
| 5,866,949 | 2/1999 | Schueller | 257/778 |
| 5,903,662 | 5/1999 | DeCarlo | 382/151 |
| 5,977,640 | 5/1999 | Bertin et al. | 257/777 |

OTHER PUBLICATIONS

Bhattacharya et al, "Repeatable, Reliable and Inexpensive Method of Flip–Flop Chip Bond", *IBM Technical Disclosure Bulletin*, vol. 23, No. 2, Jul. 1980, pp. 575–576.

Ecker, "Multilevel Alloy Joining System for Semiconductor Dies", *IBM Technical Disclosure Bulletin*, vol. 21, No. 7, Dec. 1978, pp. 2743–2746.

Coombs et al, "Chip Support Assembly", *IBM Technical Disclosure Bulletin*, vol. 19, No. 4, Sep. 1976, pp. 1178–1179.

Coombs, "Chip Mounting with Prestretched Joints", *IBM Technical Disclosure Bulletin*, vol. 16, No. 3, Aug. 1973, p. 767.

Miller, "Flexible Chip Joints", *IBM Technical Disclosure Bulletin*, vol. 11, No. 9, Feb. 1969, p. 1173.

Miller, "Microelectronic Device Standoffs", *IBM Technical Disclosure Bulletin*, vol. 8, No. 3, Aug. 1965, p. 380.

Anon, "Controlled C–4 Solder Joint Elongation for Improved Thermal–Mechanical Stress Relief", *IBM Technical Disclosure Bulletin*, vol. 32, No. 10B, Mar. 1990, pp. 118–119.

Getten et al, "Interface Array Connector System", *IBM Technical Disclosure Bulletin*, vol. 17, No. 2, Jul. 1974, p. 627.

Anon, "Sandwhich Composite PCBs for Minimizing Solder Interconnection/Strain", *Research Disclosure*, No. 294, Oct. 1988.

In re Rose 105 USPQ 237, Mar. 22, 1955.
In re Reven 156 USPQ 679, Mar. 7, 1968.

*Primary Examiner*—Patrick Ryan
*Assistant Examiner*—Kiley Stoner
*Attorney, Agent, or Firm*—Pollock, Vande Sande & Amernick; Lawrence R. Fraley

[57] ABSTRACT

A solder interconnection between a module and printed circuit board or card is provided by a plurality of solder connections arranged in a micro grid array joining solder wettable pads on a major surface of the module to a corresponding set of solder wettable pads of the printed circuit board or card. The solder connections are column shaped with the height of each connection being at least about 1.4 times the diameter of the connection.

12 Claims, 1 Drawing Sheet

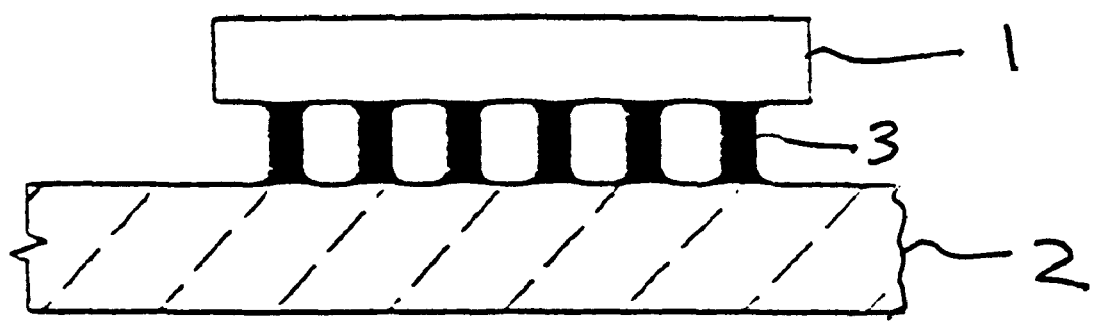

MICRO GRID ARRAY SOLDER INTERCONNECTION STRUCTURE FOR SECOND LEVEL PACKAGING JOINING A MODULE AND PRINTED CIRCUIT BOARD

DESCRIPTION

TECHNICAL FIELD

The present invention relates to interconnection structures for joining an electronic array module to a printed circuit board or card, and more particularly to a structure for forming solder interconnection joints that exhibit reduced stress resulting from thermal mismatch of the module and the printed circuit board. The present invention is especially suitable in providing micro ball grid arrays ($\mu$BGA). The present invention is also concerned with the method for fabricating such interconnection structures.

BACKGROUND OF INVENTION

Micro ball grid array ($\mu$BGA) refers to a surface mounting packaging technique whereby the solder ball array pattern is typically less than about 0.75 mm pitch. This is contrasted to conventional ball grid array technology whereby the pitch is at least about 1.0 mm. Pitch refers to the distance measured from the center of an adjoining solder ball to the center of the next adjacent solder ball.

In second level packaging of an electronic array module or chip carrier to a printed circuit board or card, the solder interconnection is rigid and cannot flex under thermal mismatch conditions. As ball to ball spacing shrinks to 0.75 mm pitch and less, the diameter of the ball must be reduced to achieve such spacing. This results in a lower stand off between the module and printed circuit board or card, resulting in less resilience to stress during expected thermal cycles due to the thermal mismatch between the module and the printed circuit board. The reliability of such a second level package interconnect is therefore jeopardized due to the loss of resilience to stress. Accordingly, $\mu$BGA has seen limited industrial applications because of reliability concerns. Reliability can be addressed by employing epoxy compositions to adhere the $\mu$BGA package to integrated circuit boards or cards in order to minimize the effects of thermal mismatch between the device and the circuit board or card. However, this is not especially satisfactory since the epoxy compositions cannot be reworked in that they are thermosetting polymer materials.

SUMMARY OF INVENTION

An object of the present invention is to minimize the problem from thermal mismatch between electronic array modules surface mounted on a printed circuit board or printed circuit card. According to the present invention, the reliability is significantly increased. More particularly, the present invention is concerned with a solder interconnection for forming connection between a module or chip carrier and printed circuit board or printed circuit card that comprises a plurality of solder connections arranged in a micro area grid array that joins solder wettable pads on a major surface of the module to a corresponding set of solder wettable pads of the printed circuit board or card. According to the present invention, the solder connections are column shaped with the height of each connection being at least about 1.4 times its diameter. By employing the required column shaped interconnections specified by the present invention, the stand off distance between the module and printed circuit board or card is significantly increased. This in turn increases the resilience of the connection during stress experienced during thermal cycles due to the thermal mismatch between the module and printed circuit board or card.

The present invention is also concerned with the method for interconnecting a module to a printed circuit board or card which comprises attaching the circuit module to the printed circuit board or card by a plurality of solder interconnections that extend from solder wettable pads on a major surface of the module to a corresponding set of solder wettable pads of the printed circuit board or card. The solder connections are column shaped with the height of each of the connections being at least about 1.4 times its diameter and the solder connections are arranged in a micro area grid array.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

DESCRIPTION OF DRAWING

The FIGURE is a schematic diagram of a solder interconnection pursuant to the present invention.

BEST AND VARIOUS MODES FOR CARRYING OUT INVENTION

To facilitate an understanding of the present invention, reference is made to the figure. In the figure, numeral 1 represents the electronic array module or chip carrier joined to the printed circuit board or printed circuit card 2 by the solder columns 3. The columns are arranged in a micro grid array with a column pitch of 0.75 mm or less and preferably about 0.5 mm to about 0.75 mm. Pitch refers to the distance from the center of an adjoining column to the center of its adjacent column or columns. It is critical to the present invention that the height of each column be at least about 1.4 times its diameter and typically no greater than about 2.5 times its diameter, a preferred range being about 1.5 to about 2.5 times its diameter. Some typical columns according to the present invention are about 9 mils to about 13 mils in diameter, and about 12.5 mils to about 33 mils in height depending upon the diameter. For example, the height for a 9 mil diameter column is typically about 12.5 to about 22.5 mils, and for a 13 mil diameter column is typically about 18 to about 33 mils. In a specific example, the diameter of the column can be about 12.5 mils with the height being at least 17.5 mils and preferably about 31 mils. In addition, according to the present invention, each of the columns is approximately the same height and substantially the same diameter throughout the entire column.

It is desirable that the solder columns be non-collapsible at temperature used in fabricating the structures of the present invention. Typically, the column should be non-collapsible at temperatures of at least about 220° C. A typical solder composition employed is an alloy of about 90% by weight lead, and about 10% by weight tin.

The solder is connected to a wettable contact pad (not shown) on the module and to a corresponding solder wettable contact pad (not shown) on the printed circuit board. Typically, the contact pads are copper. The modules are ceramic or organic substrates that carry integrated circuit chips as is well known in the art. Typical ceramic carriers include silicon oxides and silicates such as aluminum silicate, and aluminum oxides. The organic substrates can include thermoplastic and/or thermosetting resins. Many of such substrates contain the resin and a reinforcing material such as fiberglass. Typical thermosetting resins include FR-4 epoxy resins, phenolic based materials, BT resins and polyimides. Examples of thermoplastic polymers include polyolefins such as polypropylene, polysulfones, fluorocarbon polymers, polyethylene terephthalate, polycarbonates, nitrile rubbers and ABS polymers.

The printed circuit boards or cards can be any of the printed circuit boards or cards well known in the art such as those from fiber reinforced epoxy resin compositions.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A solder interconnection for forming connection between an electronic array module and printed circuit board or card comprising a plurality of solder connections arranged in a micro area array having a pitch of about 0.75 mm or less joining solder wettable pads on a major surface of said module to a corresponding set of solder wettable pads of said printed circuit board or card; wherein said solder connections are column shaped with the height of each of said connections being at least about 1.4 times its diameter.

2. The solder interconnection of claim 1 wherein the pitch of the array of said connections is about 0.5 mm to about 0.75 mm.

3. The solder interconnection of claim 1 wherein said solder connections are non-collapsible at the temperature employed to fabricate the interconnection.

4. The solder interconnection of claim 3 wherein said temperature is at least about 220° C.

5. The solder interconnection of claim 1 wherein the height of said connections is up to about 2.5 times the diameter of said connections.

6. The solder interconnection of claim 1 wherein the height of said connections is about 1.5 to about 2.5 times the diameter of said connections.

7. The solder interconnection of claim 1 wherein each column is about the same height and substantially the same diameter throughout each column.

8. The solder interconnection of claim 1 wherein said columns are an alloy of about 90% by weight lead and about 10% by weight tin.

9. The solder interconnection of claim 1 wherein said module comprises a ceramic substrate.

10. The solder interconnection of claim 1 wherein said module comprises an organic polymer substrate.

11. The solder interconnection of claim 1 wherein said connections are about 9 mils to about 13 mils in diameter and about 12.5 mils to about 33 mils in height.

12. The solder interconnection of claim 1 wherein said connections are about 12.5 mils in diameter and at least about 17.5 mils in height.

* * * * *